(12) United States Patent
Khalid

(10) Patent No.: US 11,885,675 B1
(45) Date of Patent: Jan. 30, 2024

(54) ELECTRO-OPTICAL ANALOG TO DIGITAL CONVERSION

(71) Applicant: ALAZAR TECHNOLOGIES INC., Pointe-Claire (CA)

(72) Inventor: Najeeb Ashraf Khalid, Westmount (CA)

( * ) Notice: Subject to any disclaimer, the term of this patent is extended or adjusted under 35 U.S.C. 154(b) by 0 days.

(21) Appl. No.: 18/170,098

(22) Filed: Feb. 16, 2023

(51) Int. Cl.
*G01J 1/44* (2006.01)
*H03M 1/12* (2006.01)

(52) U.S. Cl.
CPC .................. *G01J 1/44* (2013.01); *H03M 1/12* (2013.01); *G01J 2001/446* (2013.01); *G01J 2001/4413* (2013.01); *G01J 2001/4473* (2013.01)

(58) Field of Classification Search
CPC ........ H03M 1/12; H03M 1/122; H03M 1/123; H03M 1/124; H03M 1/127; H03M 1/14; H03M 1/001; H03M 1/10; H03M 3/00; H03M 1/00; G01J 2001/446; G01J 2001/4413; G01J 2001/448; G01J 1/44
See application file for complete search history.

(56) References Cited

U.S. PATENT DOCUMENTS

| | | | |
|---|---|---|---|
| 9,201,287 B1* | 12/2015 | Taylor | G02F 7/00 |
| 2014/0185125 A1* | 7/2014 | Kanter | H03M 1/124 |
| | | | 359/279 |
| 2015/0268418 A1* | 9/2015 | Sevigny | G02B 6/3853 |
| | | | 385/50 |
| 2017/0093499 A1* | 3/2017 | Liboiron-Ladouceur | |
| | | | H04B 10/60 |

* cited by examiner

*Primary Examiner* — Georgia Y Epps
*Assistant Examiner* — Don J Williams

(57) ABSTRACT

Electro-optical conversion of an input analog signal and optical modulation of the optical signal to provide light of different intensity levels to $2^n$ photodetection sites whose outputs can be encoded as an n-bit digital output value. The sample rate can exceed 10 GHz (rates above 100 GHz are possible) with much greater simplicity of electronic circuitry.

12 Claims, 5 Drawing Sheets

ELECTRO-OPTICAL ANALOG TO DIGITAL CONVERSION

TECHNICAL FIELD

The present application relates to high-speed analog to digital conversion.

BACKGROUND

Fast Analog to Digital converters, circuits that convert analog signal to digital values, use $2^n$ array of comparators that have the input signal applied to one input and an ascending reference voltage to the other. The ascending reference voltage being generated by a $2^n$ series of equal valued resistors where a voltage is applied at one end and ground at the other. The comparators are then input to an encoder that will convert the $2^n$ signal to n bits.

Here n is the resolution of the converter circuit.

The speed is the clock rate at which the circuits operate, i.e., the rate at which the input analog signal is sampled. Sampling the input signal at twice the frequency of the highest frequency component of the signal (Nyquist frequency) will reproduce the input signal.

As n increases from n to n+1, the complexity of this circuit doubles. The number resistors and comparators doubles with rise in noise and distances, both effecting the maximum speed possible for a given resolution.

The most significant issues here is not the semiconductor technology used to implement the circuit, which is a limitation also, but the components (resistors and comparators) that are effected by increase of $2^n$.

SUMMARY

Applicant proposes to use electro-optical conversion of an input analog signal and optical modulation of the optical signal to provide light of different intensity levels to $2^n$ photodetection sites whose outputs can be encoded as an n-bit digital output value. The sample rate can exceed 10 GHz (rates above 100 GHz are possible) with much greater simplicity of electronic circuitry.

In some embodiments, there is provided an analog to digital conversion device comprising a light source having an analog electrical signal input and an optical output at an output optical power level variable as a function of a level of the electrical input, a waveguide connected to the optical output at an input and emitting over a detection surface of the waveguide a decaying level of optical power in proportion to the output optical power level, an array of $2n$ photosensitive circuit elements on a single semiconductor substrate coupled with the surface of the waveguide, each one of the photosensitive circuit elements having a digital output depending on light intensity and positioned to receive a different level of optical power depending on its position in the array, and an encoder responsive to the digital output from each one of the $2^n$ photosensitive circuit elements and having a digital value output of n-bits.

The device may include a preamplifier connected to the analog electrical input for amplifying an analog input. The array of $2^n$ photosensitive circuit elements on a single semiconductor substrate may comprise photodiodes. The photosensitive circuit elements may each comprise a comparator receiving and comparing an output from the photodiodes to a threshold for generating the digital output.

The photodiodes may be germanium on silicon. The device may be operable to provide the digital value output at a frequency greater than 10 GHz, preferably greater than 100 GHz.

The array of $2^n$ photosensitive circuit elements and the encoder may be implemented in germanium.

The waveguide may be a continuous gradient neutral density waveguide.

The digital value output may be linearly proportional to the level of the electrical input.

The light source, the waveguide, the array of $2^n$ photosensitive circuit elements and the encoder may be integrated into a common package.

In some embodiments, there is provided a method for converting an analog electrical signal to a digital value, comprising converting an electrical input signal into an optical signal whose intensity corresponds to an analog level of the electric input signal, modulating the optical signal over a detection area so as to have a locally variable intensity as a function of position on the detection area, detecting at $2^n$ locations within the detection area a light intensity threshold to provide $2^n$ bits corresponding to $2^n$ levels of the analog level of the electric input signal, and converting the $2^n$ bits into an n-bit digital value.

BRIEF DESCRIPTION OF THE DRAWINGS

The invention will be better understood by way of the following detailed description of embodiments of the invention with reference to the appended drawings, in which.

DETAILED DESCRIPTION

The invention disclosed here provides a solution to the limitation of speed and resolution of the input stage where the detection of the value of the input signal is detected, i.e. the voltage of the input signal through parallel comparison of the signal to $2^n$ different refence voltages. The limitation comes from the connection and resistors required to do this along with the comparators. The logic conversion of encoding $2^n$ to n is in the digital domain therefore not being limited by the same factors as the comparator circuit.

Figure 1:
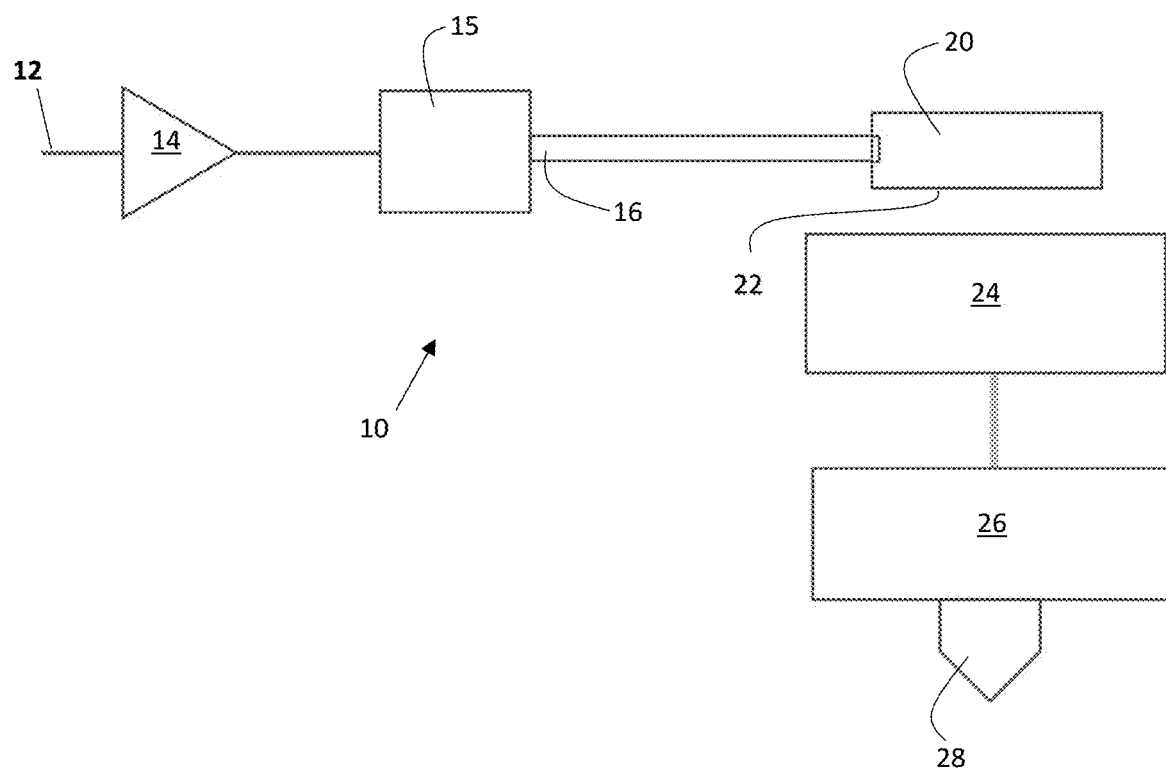
FIG. 1: System diagram of the solution described in the disclosure.

FIG. 1 shows a schematic block diagram of the ADC device 10 comprising an analog input 12, an amplifier 14 (optional) for amplifying the input 12 that drives an optical source 15 to produce an output power output 16. The output 16 is then coupled with a modulator 20 that may have an output window 22 with a variability in output intensity over the output window 22. The output 22 of the modulator 20 is optically coupled with an array of light detectors 24 that produces individual digital bits for each light detector responsive to a different light level at the output 22. The photodetectors 24 may be an exact power of 2 in number, i.e. $2^n$. An encoder 26 can convert the $2^n$ bits into a n-bit digital value or word 28. For example, 4096 detector bits can be encoded by encoder 26 into a 12-bit value 28.

Thus, the input analog signal 12 is first converted to light 16 through modulating a source 15, for example an LED or a laser, with the desired bandwidth.

The light source 15 can be butt coupled to an optical modulator 20, for example a Continuous Gradient Neutral Density (CGND) device. This device 20 can attenuate the light 16 such that light intensity varies linearly with the distance from one end of the device to the other at the exit window 22 (see FIG. 2). The range of the light intensity versus voltage can be $V_{max}-V_{min}=D$. The relationship between voltage and current can be determined by the V to I curve of the device 15 being used to generate the light (FIG. 3).

The CGND device 20 can be a light guide with properties of absorption in the long direction such that the light attenuates as it travels. An elongated quartz glass waveguide member can be used with a cross-section that is round, square or rectangular. On one side of the device, along the length can be a very narrow window, barely bigger than the detector array and at least as long the detector array. On the window can be a coating that provides a continuous gradual increase in density from one end to the device to other along the length of the device. The result can be that if light is injected into one end of the device, some of it will come out through the window with gradually increasing or decreasing intensity. The range of intensity will reflect the range of the neutral density filter being coated on. Normal coatings of continuous gradient density are 0-0.4 D to 0-4 D, where D is one order of magnitude.

Therefore, the property of the optical modulator can be such that over the distance X, the length of the device, the total absorption can be between 0.5 D to 4 D (i.e. from 0.5 to 10,000).

Another example would be a waveguide or optical fiber with side losses that provides for a decreasing intensity of laterally emitted light along the waveguide. Such a variant need not rely on an absorption filter coating.

Another example would be a waveguide made of a material that slowly absorbs light of the desired wavelength such that light is attenuated along the length of the waveguide. Colored glass can have the desired property for the wavelengths other than the color of the glass seen. The effect can be a continuous gradient neutral density device for the specific wavelength.

The optical modulator can alternatively rely on free-space optics, however, an optical modulator that is easy to contain in a package with the light source and photodetector array is preferred.

In all cases the value of density/intensity modulation range may depend on the photodetector array such that the resolution is as desired but limited by the properties of the photodetector. The properties are the sensitivity, the width of the detector and the speed of response of the detector.

The calculation may be (density range/$2^n$)*(light Intensity at input).

The length of the device may be l=width of the photodetector*$2^n$.

Height of the output window may be a minimum of twice the height of detector.

Figure 5:
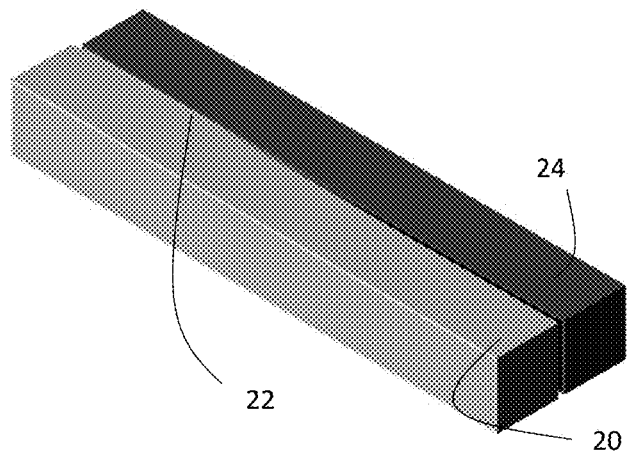
FIG. 5: Photo detector array and CGND device arrangement.

The window of the CGND may be coupled to an array of photodetectors (FIG. 5).

This disclosure of the voltage to light conversion and detection of the light intensity via an array of photodetectors can eliminate the limitation on present technology to fabricate high speed and higher resolution analog to digital converters. The photodetectors array may be constructed of an array of identical photodetectors with a threshold detection circuit and buffer connected to a logic encoder of $2^n$ to n bits.

In the preferred embodiment, the output of the photodetector array can be monolithically fabricated with a $2^n$ to n bit encoder.

The electron mobility of the semiconductors used to fabricate the photodetectors may determine the highest speed and resolution that can be achieved.

In the preferred embodiment, the semiconductor technology can be Ge on Si that can achieve 500 GHz speed of the transistors and 5 picosecond photodetector response.

Figure 2:
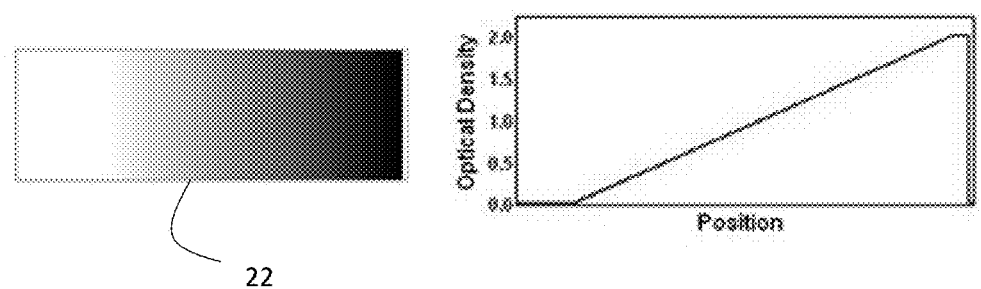
FIG. 2: Continuous Gradient Neutral Density device window and corresponding characteristic profile.
Figure 3:
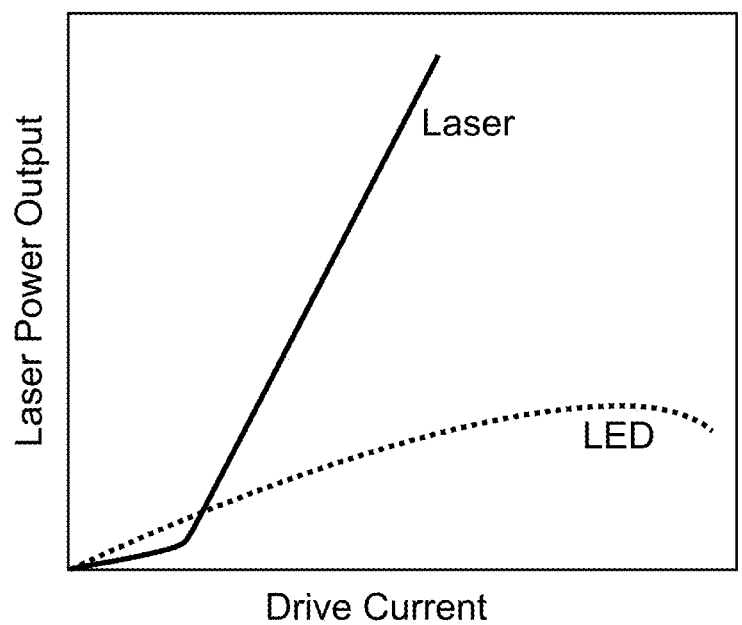
FIG. 3: A plot of laser power output as a function of drive current for a laser and an LED.
Figure 4:
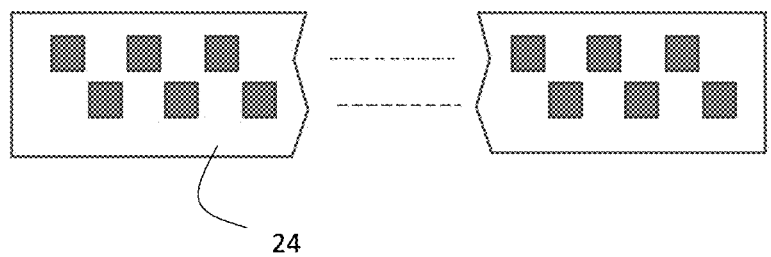
FIG. 4: Photodetector array.

A one dimensional array of photodetectors, $2^n$, can be placed in close proximity alongside the CGND device (optical modulator) such that each photodetector can detect the light from a different point in the variable gradient of the light from the CGND (FIG. 2).

Each detector may have an amplifier or buffer connected to it and these $2^n$ amplifiers or buffers are then input to an encoder circuit (FIG. 5) that will encode the $2^n$ inputs to n outputs.

The speed of this analog to convertor device can then depend on the speed of the detectors, amplifier and encoder technology. The bandwidth of the system can then be dictated by the smallest of the bandwidth of the signal path, i.e. the receiving buffer/amplifier, the photodetectors, the photodetector buffer/amplifies and the combinatorial logic circuit for forming the encoder. The photodetector and the combinatorial logic encoder can be integrated and fabricated as a monolithic device on a semiconductor substrate.

Figure 6:
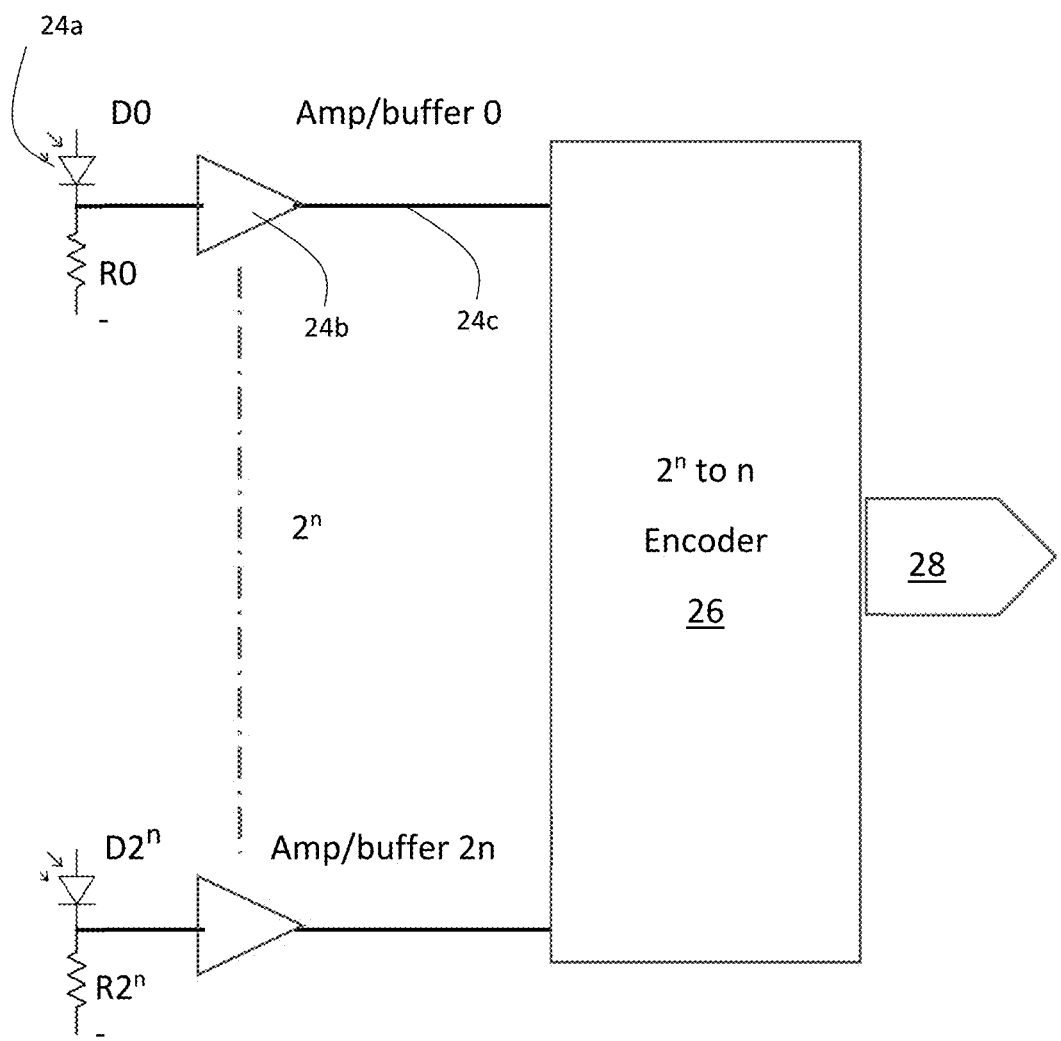
FIG. 6: Photodetector array and encoder combinatorial circuit.

One embodiment (see FIG. 7) can be germanium on silicon semiconductor technology to implement the circuit in FIG. 6, capable of 100 GHz operation. The resolution depends on the number of detectors in the array to be n=antilog ($2^n$).

As illustrated in FIG. 6, photodiodes 24a can be used. The photodiodes can be connected to a voltage source that may be common to all detectors. A resistor R0 to R2n can be connected between the output of the photodiodes and ground. Comparators 24b can be connected to the output of the photodiodes to produce a binary digit on traces 24c. In this way, a light threshold detector circuit can be provided. The comparators act as amplifier/buffer circuits and output a bit each. Such circuits are known in the art and have a very high rate of repeatability and performance. While a phototransistor can be used instead of a photodiode, the photodiode can be simpler to implement.

Figure 7:
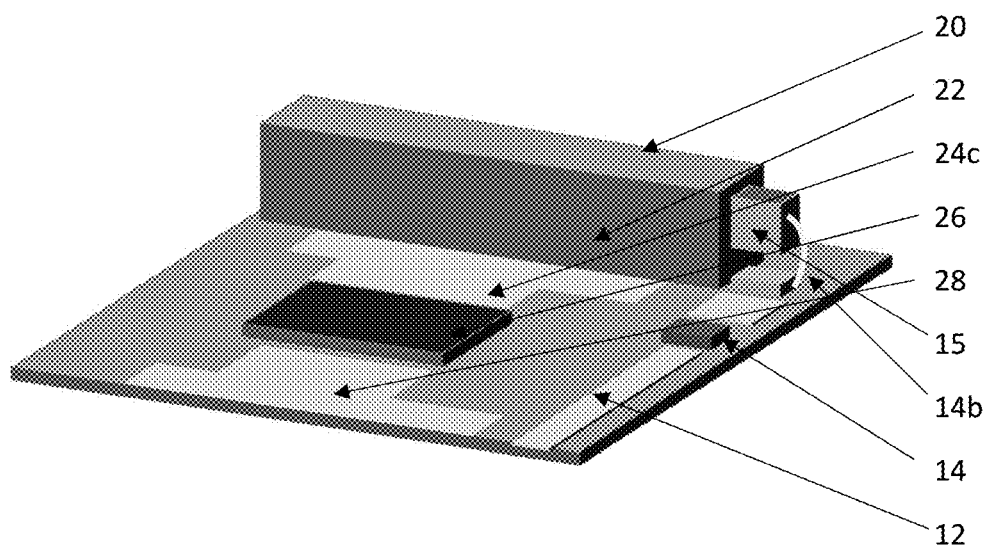
FIG. 7: An arrangement of the components in the integrated A/D converter of one embodiment.

The arrangement of the components in the integrated A/D converter as one of the embodiments is in FIG. 7. As shown, the array of light detectors 22 can be on the semiconductor substrate, while the optical modulator 20 can be mounted on the detector array 22. The light source 15 can be connected to the modulator 20 above the substrate and connected to the amplifier/buffer 14 on the substrate through a wire bond connection 14b. It will be appreciated that the light source can alternatively be on the substrate surface with the modulator 20 adapted to receive and redirect light from the source 15.

What is claimed is:

1. An analog to digital conversion device comprising:
a light source having an analog electrical signal input and an optical output at an output optical power level variable as a function of a level of said electrical input;
a waveguide connected to the optical output at an input and emitting over a detection surface of said waveguide a decaying level of optical power in proportion to said output optical power level;

an array of $2^n$ photosensitive circuit elements on a single semiconductor substrate coupled with said surface of said waveguide, each one of the photosensitive circuit elements having a digital output depending on light intensity and positioned to receive a different level of optical power depending on its position in said array; and an encoder responsive to said digital output from each one of the $2^n$ photosensitive circuit elements and having a digital value output of n-bits.

2. The device of claim 1, further comprising a preamplifier connected to said analog electrical input for amplifying an analog input.

3. The device of claim 1, wherein said array of $2^n$ photosensitive circuit elements on a single semiconductor substrate comprise photodiodes.

4. The device of claim 3, wherein said photosensitive circuit elements each comprise a comparator receiving and comparing an output from said photodiodes to a threshold for generating said digital output.

5. The device of claim 4, wherein said photodiodes are germanium on silicon.

6. The device of claim 1, wherein said device is operable to provide said digital value output at a frequency greater than 10 GHz.

7. The device of claim 6, wherein said frequency is greater than 100 GHz.

8. The device of claims 7, wherein said array of $2^n$ photosensitive circuit elements and said encoder are implemented in germanium.

9. The device of claim 1, wherein said waveguide is a continuous gradient neutral density waveguide.

10. The device of claim 1, wherein said digital value output is linearly proportional to said level of said electrical input.

11. The device of claim 1, wherein said light source, said waveguide, said array of $2^n$ photosensitive circuit elements and said encoder are integrated into a common package.

12. A method for converting an analog electrical signal to a digital value, comprising:

converting an electrical input signal into an optical signal whose intensity corresponds to an analog level of said electric input signal;

modulating said optical signal over a detection area so as to have a locally variable intensity as a function of position on the detection area;

detecting at $2^n$ locations within the detection area a light intensity threshold to provide $2^n$ bits corresponding to $2^n$ levels of said analog level of said electric input signal; and converting the $2^n$ bits into an n-bit digital value.

* * * * *